United States Patent
Wang et al.

(10) Patent No.: US 7,361,522 B2
(45) Date of Patent: Apr. 22, 2008

(54) GROWING LOWER DEFECT SEMICONDUCTOR CRYSTALS ON HIGHLY LATTICE-MISMATCHED SUBSTRATES

(75) Inventors: Yongqian J. Wang, Chandler, AZ (US); Yuxia Sun, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/391,528

(22) Filed: Mar. 28, 2006

(65) Prior Publication Data
US 2007/0238211 A1    Oct. 11, 2007

(51) Int. Cl.
*H01L 21/00* (2006.01)

(52) U.S. Cl. ............... 438/47; 438/46; 977/932
(58) Field of Classification Search .............. 438/46, 438/47
See application file for complete search history.

(56) References Cited

U.S. PATENT DOCUMENTS 6,831,017 B1 * 12/2004 Li et al. ............... 438/694
2006/0091408 A1 * 5/2006 Kim et al. ............... 257/94

OTHER PUBLICATIONS

Sakai et al. "A new method of reducing dislocation density in GaN layer grown on sapphire substrate by MOVPE," Journal of Crystal Growth 2000.*
Kuykendall et al., "Crystallographic Alignment of High-Density Gallium Nitride Nanowire Arrays", Advanced Online Publication, 2004.

* cited by examiner

*Primary Examiner*—B. William Baumeister
*Assistant Examiner*—Matthew L. Reames
(74) *Attorney, Agent, or Firm*—Trop, Pruner & Hu, P.C.

(57) ABSTRACT

A heterosystem of two different materials, mismatched in terms of lattice constant or symmetry, may be formed with reduced defects by using a two step approach proposed in this invention. Nanowires are first grown on a semiconductor substrate, and then a thin film of the disparate crystallographically inconsistent material is grown from the nanowires through a two dimensional growth mode. The nanowire material may better match crystallographically to both the substrate and the grown film, or is simply the same as the grown film.

7 Claims, 2 Drawing Sheets

GROWING LOWER DEFECT SEMICONDUCTOR CRYSTALS ON HIGHLY LATTICE-MISMATCHED SUBSTRATES

BACKGROUND

This relates generally to the growth of lower defect materials on highly lattice-mismatched substrates.

It is desirable to grow disparate materials on top of one another. Some materials have such inconsistent crystallographic structures that, if one material is grown on the other, a high number of defects may result. The possible defects may include threading dislocations, interfacial or horizontal dislocations, dislocation loops, voids, nanopipes, small angle grain boundaries, and pits.

For example, in order to grow gallium nitride on sapphire with low defect density, various approaches have been proposed. Gallium nitride is of particular interest because it has a relatively high melting point, carrier mobility, electrical breakdown field, and a bandgap for light in the blue-ultraviolet regime, making gallium nitride desirable in high power optoelectronic applications.

In one approach, known as epitaxial lateral overgrowth, the substrate surface is patterned with a dielectric material, such as silicon dioxide, with periodic openings. Then the gallium nitride is selectively grown in these openings. Once the gallium nitride grows to a thickness of the mask layer, it begins to grow laterally, coalescing into a continuous film. While this works, the number of defects that are formed may be undesirable.

Generally, it is difficult to grow or deposit one material on another material without introducing a significant number of crystal defects when the two materials have different symmetry and/or lattice constants. However, it may nonetheless be desirable to do so.

Various materials may be crystallographically inconsistent with one another. Such materials may be called lattice-mismatched material systems or lattice-mismatched heterosystems. Examples of such lattice-mismatched heterosystems include gallium nitride on sapphire or gallium nitride on $Al_2O_3$. In such cases, a relatively large mismatch strain occurs, for example, greater than about 15 percent, if one of these materials were grown directly on the other. Direct epitaxial growth of gallium nitride film on sapphire has extremely high dislocation densities, largely interfacial and threading dislocations, which may significantly deteriorate the photonic and microelectronic device quality and performance. Thus, significant effort has been made to reduce the dislocation density of epitaxial layers on gallium nitride.

Among the possible applications of such lattice-mismatched heterosystems, single crystalline gallium nitride devices show promise for realizing photonic and biological nanodevices such as green light emitting diodes, shortwave ultraviolet nanolayers, and nanofluidic biochemical sensors.

Of course, the problem with these devices is that they necessitate the formation of highly lattice-mismatched heterosystems. The systems are lattice-mismatched because there is a discontinuity in either or both of the symmetry and lattice constant between the two materials. Generally, symmetry and similar lattice constants may be needed in order to successfully epitaxially deposit one material on another. In the absence of such matching of lattice constants and symmetry, techniques are needed that result in lower defects.

DETAILED DESCRIPTION

In accordance with some embodiments of the present invention, materials with disparate crystal structures can be grown on top of one another with reduced defect density. This may be done by a two-step approach proposed here: growing nanowires on a semiconductor substrate and then growing a thin film of the disparate crystallographically inconsistent material from the nanowires through a two dimensional growth mode. The material for nanowires may be one that better matches crystallographically to both the substrate and the grown film or at least better matches the grown film. In most cases, it can simply be the same material as the grown film. Because the nanowires may be defect-free and have no relative rotation or tilting relative to each other, lower defect densities may result in some embodiments. If the distance between the nanowires is suitably controlled, defects may further be reduced when the disparate material is grown and laterally expands from the tops of those nanowires.

Figure 1:
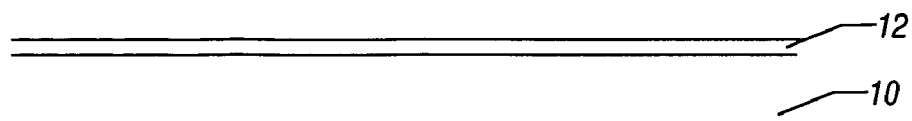
FIG. 1 is an enlarged, partial, cross-sectional view at an early stage of manufacture in accordance with one embodiment of the present invention.

Referring to FIG. 1, catalyst particles 12 may be formed on the substrate 10. In one embodiment of the present invention, the substrate 10 may be formed of sapphire and it may be desired to grow gallium nitride over substrate 10. However, the present invention is not limited to any particular materials, and the ensuing discussion of gallium nitride over sapphire is only exemplary. Other possible materials include aluminum or indium gallium nitride, aluminum nitride and indium nitride. Other substrates include silicon and silicon carbide. Because heterosystems may have different symmetry and lattice constants, defect generation is expected.

Figure 2:
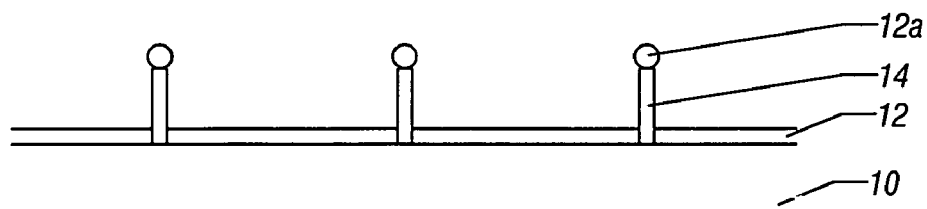
FIG. 2 is an enlarged, partial, cross-sectional view corresponding to FIG. 1 at a subsequent stage of manufacturing in accordance with one embodiment of the present invention.

Nanowires 14 of gallium nitride may be grown as indicated in FIG. 2. The nanowires 14 may be formed by vapor-liquid-solid (VPS) techniques or metal-organic chemical vapor deposition (MOCVD). A "nanowire" is a high aspect ratio (height to width ratio of at least two) structure having a width or lateral dimension on the order of a few hundred nanometers or less. Nanowire 14 aspect ratios may, for example, be from 3 to 1000 and most preferably are from 5 to 100, depending upon the material heterosystems. In some embodiments, the nanowires 14 have a width of less than 500 nanometers.

A layer of catalyst or initiator particles 12 such as nickel, gallium, gold, or alloys of the same metals may be formed on the substrate 10. In one embodiment, the catalyst is thermally evaporated on the substrate. The nanowires 14, having exactly the same crystallographic orientations, in some embodiments, may be grown on the substrate 10, under the influence of the catalyst particles 12. Catalyst particles 12a may reside on top of the nanowires 14 as they grow. The densities of the nanowires 14 may be adjusted by controlling the density of the catalytic particles 12.

Since the diameter or width of the nanowires 14 is in the range of a few hundred of nanometers, at most, the nanowires may be entirely or substantially dislocation free. In one embodiment, the nanowires 14 are grown to a height of a few microns. In some embodiments, the nanowires 14 are formed of the same material that will form the lattice-mismatched epi-layer. For example, at a temperature of 900° C. in an oxygen-free environment and at atmospheric pressure, trimethyl gallium in a cooled bath may be exposed to nitrogen gas to form a precursor that is supplied together with hydrogen and ammonia for five to thirty minutes, in one embodiment.

When a semiconductor layer is epitaxially grown on top of a lattice-mismatched semiconductor substrate, the epitaxial layer is strained elastically to be in registry with the substrate lattice at small layer thicknesses, h. The interface is perfectly coherent or pseudomorphic. As the layer thickness h increases, strain energy builds up and dislocations are introduced into the epilayer upon reaching a critical thickness. The critical thickness for gallium nitride over sapphire systems is less than one atomic layer. Therefore, it is thermodynamically impossible to grow a gallium nitride film without forming interfacial dislocations.

However, gallium nitride nanowires may be formed on incompatible crystal structures such as sapphire while generating less defects. One reason for generating less defects is that the nanowire has a small contact area with the substrate. In some embodiments, that contact area is in the nanometer regime, so the mismatch strain can be readily relaxed elastically. Under the action of the catalytic particles 12, one dimensional growth (normal to the interface) is favored both energetically and kinetically. The constraint of the substrate against the nanowire becomes smaller and smaller with the growth of the nanowire.

The nanowires may be epitaxially grown wurtzite gallium nitride and may have various cross-sectional profiles including triangular or hexagonal profiles depending on the growth conditions and heterosystems.

Figure 3:
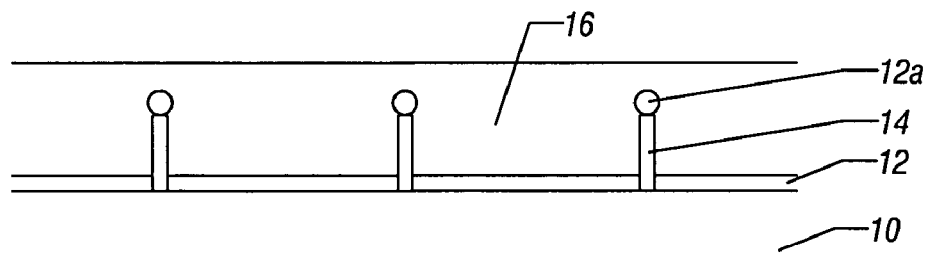
FIG. 3 is an enlarged, partial, cross-sectional view at still a subsequent stage in accordance with one embodiment of the present invention.

Once the gallium nitride nanowires 14 reach a certain height, amorphous dielectric material 16, such as amorphous silicon dioxide, can be deposited to fill up the empty space between the nanowires 14 as indicated in FIG. 3. In one embodiment, spin coated photoresist or amorphous silicon dioxide may be utilized as the material 16. The thickness of the deposited material 16 may be greater than the height of the nanowires 14 as indicated in FIG. 3.

Figure 4:
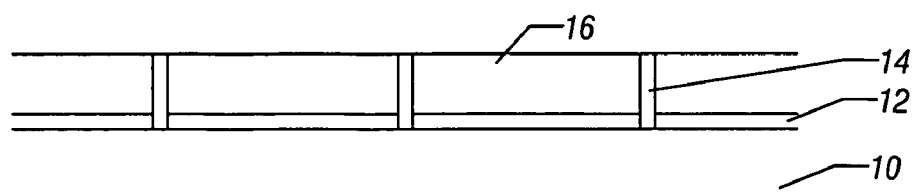
FIG. 4 is an enlarged, partial, cross-sectional view at a subsequent stage in accordance with one embodiment of the present invention.

Then, mechanical polishing may be used to remove the catalytic material 12a at the tips of the nanowires and to expose the cross-sectional area of the nanowires 14 as indicated in FIG. 4. The amorphous dielectric material 16 may have a small thermal mismatch to both the yet to be formed epi-layer and the substrate 14. A plasma cleaning or other cleaning operation may be performed at this stage.

After cleaning, growth of gallium nitride may be resumed. The growth conditions may be controlled to allow growth of gallium nitride from the nanowire without new nucleation. The nucleation of gallium nitride on the surface of the dielectric film may be prevented, thereby realizing two-dimensional growth.

Figure 5:
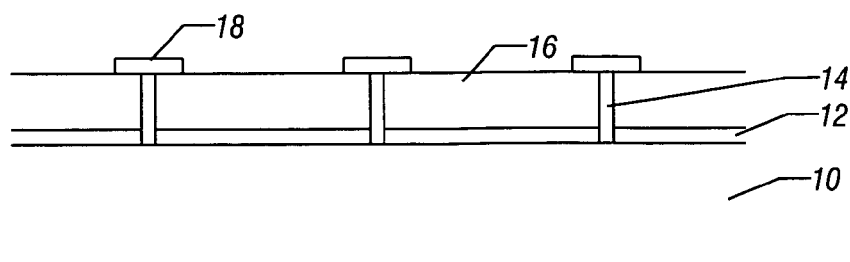
FIG. 5 is a partial, enlarged, cross-sectional view at a subsequent stage in accordance with one embodiment of the present invention.

Thus, referring to FIG. 5, the two-dimensional growth is indicated at 18. The islands of hetero material, such as gallium nitride with the nanowires 14 at the center, grow rapidly laterally since the diffusion distance of gallium and nitrogen atoms is smaller and smaller as the island grows and eventually, the islands coalesce into a single, continuous film. Thereafter, the gallium nitride film simply thickens.

Figure 6:
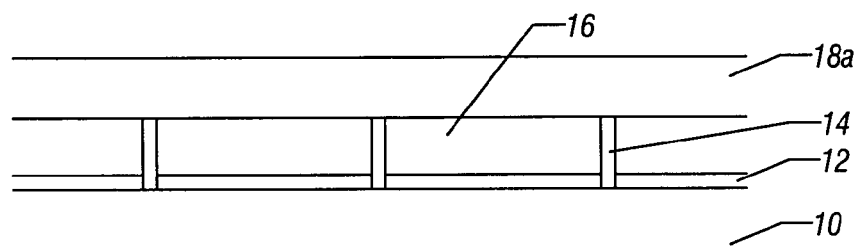
FIG. 6 is an enlarged, partial, cross-sectional view at a subsequent stage in accordance with one embodiment of the present invention.

Thus, referring to FIG. 6, a relatively thick hetero epi-layer 18a, such as gallium nitride, may be grown on an incompatible substrate 10 such as sapphire. Defects may be reduced through the use of the techniques described herein, including the presence of nanowires of the same material as is used in the ultimately grown epi-layer 18a.

Many applications of the technology described herein may be envisioned, including a variety of optoelectronic and microelectronic applications and, particularly, higher power transistors and light emitting devices applications. One of the most interesting applications at present is a blue light emitting diode. However, the present invention is not in any way limited to this particular application.

Figure 7:
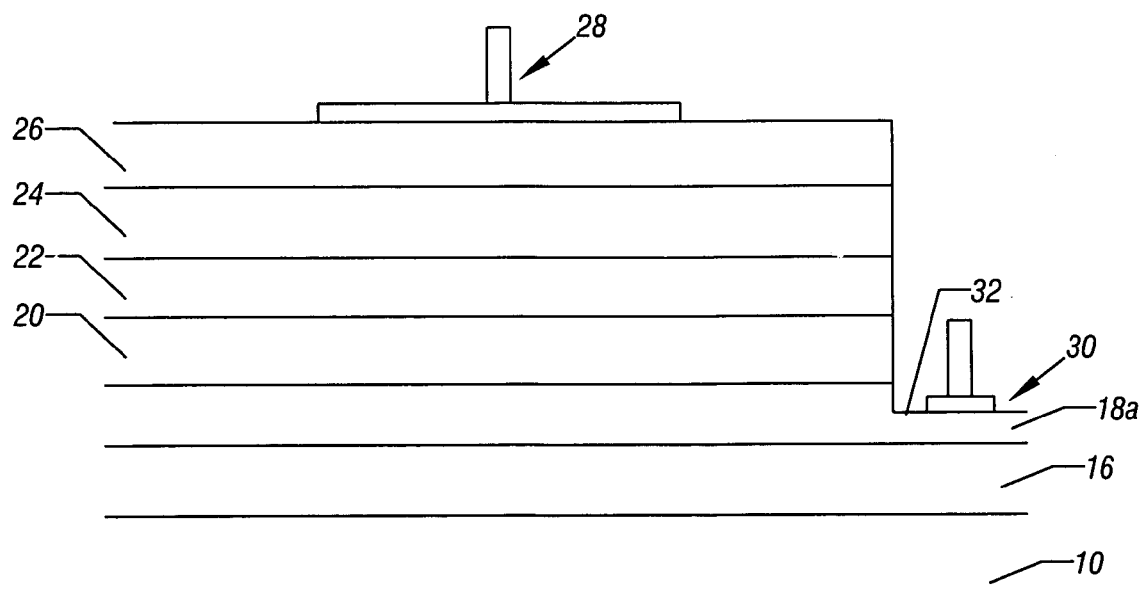
FIG. 7 is a depiction of a system in accordance with one embodiment of the present invention.

Referring to FIG. 7, a blue light emitting diode can be made using techniques described herein. Referring to FIG. 7, an upper contact 28 may be formed to a p-GaN(Mg) containing layer 26. The layer 26 is positioned over a layer 24 that may be p-AlGaN(Mg), a layer 22 of N-InGaN(Mg, Zn), and a layer 20 of n-AlGaN(Si). The layer 18a may be formed under the layer 20 and a contact 30 may be formed on a layer 18a. In this case, the layer 18a, formed as described herein, may be n-GaN(Si). The layer 16 may be gallium nitride and the layer 10 may be sapphire. In some embodiments, the layer 16 may act as a gallium nitride buffer layer and may be on the order of 0.03 microns, while the layer 18a may be formed of about four microns.

Thus, in some embodiments of the present invention, a better gallium nitride over a sapphire substrate may be formed in forming otherwise conventional blue light emitting diodes. Other applications include gallium nitride light emitters and lasers.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

growing nanowires on a first layer;

covering said nanowires with an insulator;

planarizing said insulator to form a planarized surface; and resuming the growth of nanowires after planarizing to form a planar second layer over the planarized surface, said first and second layers being lattice-mismatched layers.

2. The method of claim 1 including forming a hetero system including gallium nitride.

3. The method of claim 1 including forming a blue light emitting diode.

4. The method of claim 1 including growing nanowires having an aspect ratio of greater than 2:1 on a substrate.

5. The method of claim 4 including growing nanowires having an aspect ratio of greater than 3:1.

6. The method of claim 1 including growing gallium nitride nanowires over a sapphire substrate and forming a layer of gallium nitride over said nanowires.

7. The method of claim 1 including using catalytic particles on a substrate to grow said nanowires and planarizing to remove the particles from the top of said nanowires.

* * * * *